(12) United States Patent
McArdle et al.

(10) Patent No.: US 7,629,985 B2
(45) Date of Patent: Dec. 8, 2009

(54) METHOD FOR CREATION OF ARCHITECTURAL SPACE OBJECTS FOR AREA AND VOLUME CALCULATION

(75) Inventors: Paul McArdle, Bow, NH (US); Scott Arvin, New Boston, NH (US); Qiong Wu, Manchester, NH (US); Anna Oscarson, Manchester, NH (US)

(73) Assignee: AUTODESK, Inc., San Rafael, CA (US)

( * ) Notice: Subject to any disclaimer, the term of this patent is extended or adjusted under 35 U.S.C. 154(b) by 16 days.

(21) Appl. No.: 11/340,116

(22) Filed: Jan. 26, 2006

(65) Prior Publication Data

US 2007/0171223 A1 Jul. 26, 2007

(51) Int. Cl.
 *G06T 17/00* (2006.01)
 *G06T 11/00* (2006.01)
(52) U.S. Cl. ...................................... 345/619
(58) Field of Classification Search .................. 345/619
 See application file for complete search history.

(56) References Cited

U.S. PATENT DOCUMENTS

| | | | |
|---|---|---|---|
| 6,014,503 A * | 1/2000 | Nagata et al. .................. | 703/1 |
| 6,201,546 B1 | 3/2001 | Bodor et al. | |
| 6,323,879 B1 * | 11/2001 | Sauerbrei .................... | 345/672 |
| 6,992,685 B2 * | 1/2006 | Hallbauer et al. ........... | 345/619 |
| 7,130,774 B2 * | 10/2006 | Thomas et al. ................. | 703/1 |
| 2002/0158886 A1 * | 10/2002 | Hallbauer et al. ........... | 345/619 |
| 2002/0190982 A1 | 12/2002 | Kotcheff et al. | |
| 2005/0081161 A1 | 4/2005 | MacInnes et al. | |
| 2005/0162418 A1 | 7/2005 | Kase | |

OTHER PUBLICATIONS

Bill Kilp and John Janzen, From Architectural Desktop to Facility Management Reports, Nov. 30-Dec. 3, 2004, Autodesk University 2004, Las Vegas, Nevada, pp. 1-14.*
Mary Ellen Pennisi-Vazzana and David Driver; Designing Mechanical Systems Using Autodesk Building Systems; 2003; autodesk Press; Thomson Delmar Learning; pp. 288-305.*
International Search Report. Mar. 27, 2008.

* cited by examiner

*Primary Examiner*—Jeffery A Brier
(74) *Attorney, Agent, or Firm*—Patterson & Sheridan, LLP

(57) ABSTRACT

Embodiments of the invention allow users to generate and maintain space objects in a computer-aided design model representing regions bounded by a set of drawing elements included in the model. The space object contains the geometry of such a bounded region and may be used to calculate values such as area and volume associated with the region. Additionally, each space object may be associated with the set of drawing elements bounding the region represented by the space object such that any changes to one of the associated bounding elements causes the geometry of the space object to be updated automatically to reflect these changes. Areas and volumes calculated from the space object geometry may conform to established standards regarding the calculation of gross, net and useable areas of a building or other structure.

21 Claims, 12 Drawing Sheets

METHOD FOR CREATION OF ARCHITECTURAL SPACE OBJECTS FOR AREA AND VOLUME CALCULATION

BACKGROUND OF THE INVENTION

1. Field of the Invention

The present invention is generally directed to computer-aided (CAD) design software. More specifically, the present invention is directed to a CAD application configured to create and manipulate objects representing open space areas or volumes in a drawing or model generated using a CAD application.

2. Description of the Related Art

The term computer-aided design (CAD) generally refers to a broad variety of computer-based tools used by architects, engineers, and other construction and design professionals. CAD applications may be used to construct computer models representing virtually any real-world construct. Commonly, CAD applications are used to generate computer models of construction projects, e.g., residential homes, office buildings, roadways, bridges, etc. A CAD application may provide users with a variety of two-dimensional (2D) and three-dimensional (3D) views related to a particular design project.

Often, data contained in CAD drawing or model of a construction project is used to generate information regarding open spaces. Within the domain of architectural design, a "space" may refer to a collection of information regarding room area, wall area, room volume, etc. Also, more than one type of area may be calculated in reference to a given space. For example, the "usable" area of a room is frequently defined differently from the "gross" or "net" area of the same room. The difference between gross, net, and useable areas may be a simple offset from perimeter walls or may be based on more sophisticated rules. The calculations of the gross, net, or useable areas of a space may be measured in a variety of ways, typically based on established standards or according or specific rules.

Many building standards are available that define rules for how floor areas, wall areas, and volumes should be calculated, depending on the location and orientation of bounding elements such as the walls, floors, and ceiling. Such standards may include rules specifying, for example, how to allocate areas inside walls between adjoining rooms, or whether the perimeter of an area should be defined to run planar to the surface of a doorway or defined using the centerline of the doorway.

Such standards may also define rules that include or exclude portions of a room from the calculation of a space area or volume, based on the characteristics of the room. For example, standards established by the Swedish Institute for Standards (SIS) specify that areas in a room with a ceiling height below 1.9 meters do not fully contribute to the total area of the room. Similarly, building standards may specify that only a certain percentage of an area, volume, or perimeter of certain spaces (e.g. an enclosed patio), should be included in calculating areas. In addition to the SIS standards, other widely used standards for calculating spaces include those published by the Building Owners and Managers Association International (BOMA) and the Deutsches Institut fur Normung (DIN).

As defined by these established standards, calculations of gross, net, and useable areas are often used to generate reports such as estimates of construction cost, energy requirements/analysis, leasing documents, including the calculation of lease rates based on area, operating costs, project Development proforma documents including ROI and Construction Financing documents, etc. When users rely on these calculations to determine lease rates or to compare how much "space" proposed plans may provide, it is clearly important to obtain accurate measurements of space properties.

Currently, some CAD applications allow users to specify a set of architecture, construction and engineering elements (AEC elements) within in a CAD model to use in performing space or area calculations. For example, AEC elements may represent the doors, walls, windows, etc. of a building floor modeled in a CAD drawing. A user may select the wall elements that form a given room and direct the CAD application to calculate the area or volume of the room. However, once the area calculations are performed, the AEC elements that make up the room may be changed, moved, or removed from the CAD drawing. Thus, unless the space values are recalculated whenever the CAD drawing is modified, the calculations may become incorrect and obsolete. This makes the process of maintaining area-related information tedious and error-prone. Moreover, the definition of space boundaries in "open" floor plans may be ambiguous; without AEC elements to define a boundary between two adjoining spaces, the CAD application may be unable to perform space calculations correctly.

Accordingly, there is need for a CAD application configured to accurately calculate and maintain space and area-related data regarding open spaces present in a CAD model, including calculations of gross, net, and useable areas of space volumes or as defined by established standards or user specified rules.

SUMMARY OF THE INVENTION

Embodiments of the invention provide users of a computer-aided design application (CAD application) with features for generating, modifying and maintaining space objects in a CAD model. As used herein, a "space object" refers to an element of a CAD drawing used to represent an area or volume of open space in a 2D or 3D view generated from a CAD model. For example, the space object may represent the area of a room bounded by AEC elements such as walls, doors, windows, floors, and/or ceilings. Much like a "wall" object represents a wall or a "door" object represents a door, the space object represents areas of open space in the CAD drawing.

Once generated, the space object may provide users with calculations such as the area or volume of the space represented by the space object. For example, the gross, net, and useable areas may be calculated as these areas are defined by established standards (e.g., the BOMA or SIS standards), based on styles associated with the CAD model or elements thereof, and/or based on user input. Further, in response to user commands, the CAD application may be configured to generate space objects automatically by detecting spaces in the CAD model bounded by AEC elements such as walls, ceilings and floors, and/or by detecting regions bounded by more simple drawing elements such as lines and arcs without the user having to specify the boundary elements for a space object manually.

A space object may be associated with the drawing elements used to generate the space object. In one embodiment, the geometry of a space object may be updated as AEC elements are moved, resized, deleted, or added to the CAD drawing. For example, a space object may be updated in response to changes to AEC elements (e.g., moving the location of a wall), in response to user edits of the AEC elements associated with a given space object, or in response to changes to the standards used to calculate space properties.

Further, users may define logical boundaries for a space object that are not associated with any particular element in the drawing, creating virtual divisions between two or more different space objects that span an open region. Thus, space objects provide a sophisticated representation of the areas of open areas present in a CAD model.

As stated, space objects represent properties of open spaces in a CAD drawing or model, such as the area and volume associated with a bounded region. Typically, the space objects represent the area of rooms appearing in a construction plan. Embodiments of the invention provide space objects that may calculate areas based on a number of different boundaries to provide both the gross, net, and useable areas, calculated according to values specifying the offsets from one area boundary to another. Further, the space objects may be used to calculate areas based on established standards that govern the allocation of building area, or limit the contribution of an area based on its structure or function. Thus, embodiments of the invention may be used to provide a variety of information regarding floor area, wall area, room volume, etc. Values generated using space objects may be advantageously used to generate estimates of construction cost, energy requirements and analysis, area calculations of gross, net, and usable area, etc. Further, these values may be automatically updated when a CAD model is edited, or as it evolves throughout the course of a design project.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. Note, however, the appended drawings illustrate only typical embodiments of this invention and are therefore not to be considered limiting of its scope, for the invention may admit to other equally effective embodiments.

DETAILED DESCRIPTION

Figure 1:
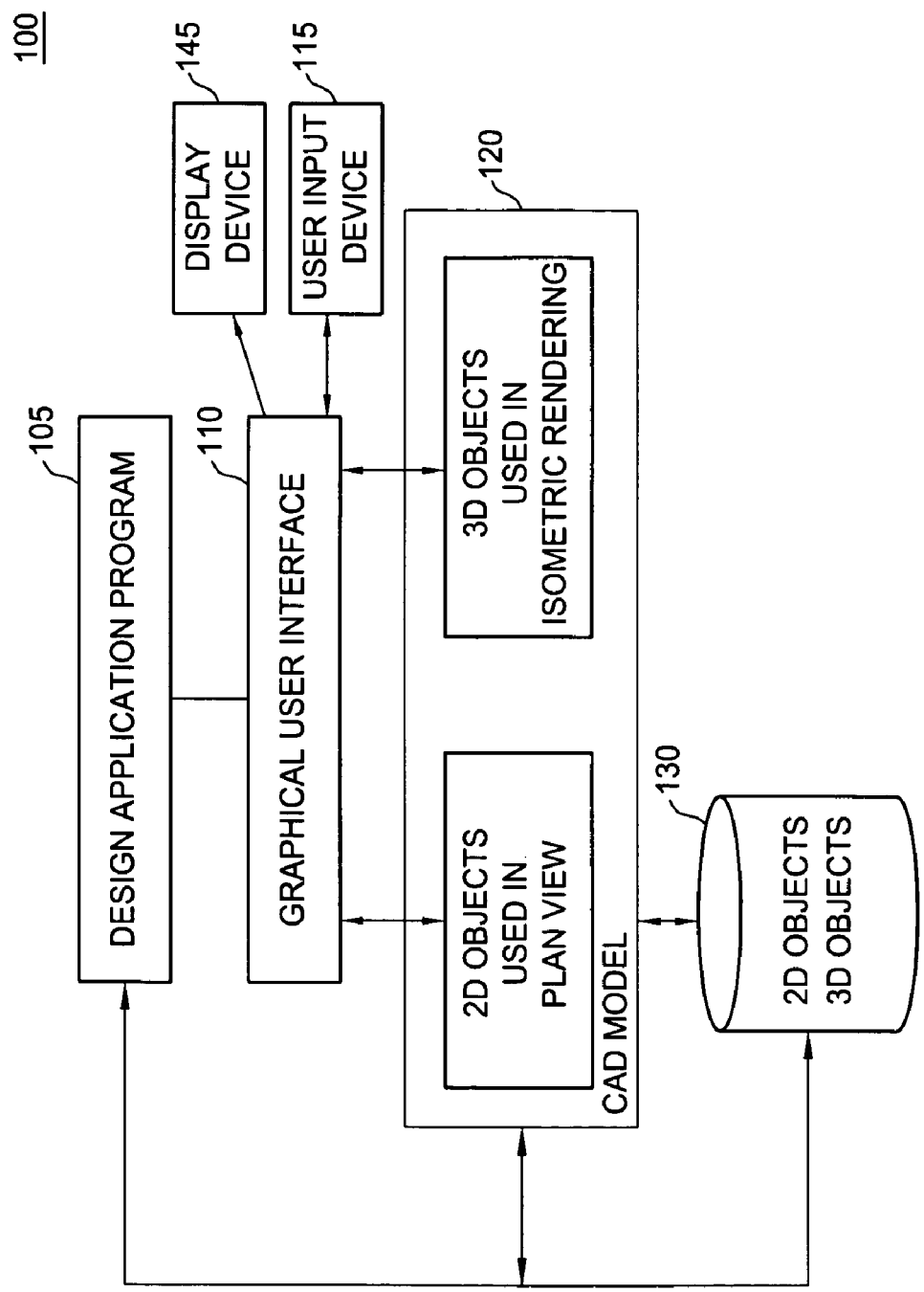
FIG. 1 is a block diagram illustrating a computer-aided design (CAD) application environment, according to one embodiment of the invention.

FIG. 1 is a block diagram illustrating a computer-aided design (CAD) application environment 100, according to one embodiment of the invention. In one embodiment, the components provided by environment 100 may include computer software applications executing on a computer system such as a desktop computer, server, laptop computer, tablet computer, and the like. However, the components illustrated in environment 100 are not limited to any particular computing environment, programming language, or computer hardware and/or software combination, and embodiments of the invention may be adapted to take advantage of new computing systems as they become available. Additionally, the components illustrated in FIG. 1 may be present on multiple systems communicating over computer networks including local area networks or wide area networks such as the Internet. For example, a graphical user interface 110 (GUI interface) may be a software application executing on a client computer communicating with a CAD application 105 and database applications 130 and 135 executing on a networked server computer.

As shown, the CAD environment 100 includes, without limitation, the CAD application 105, the GUI interface 110, a user input device 115, CAD drawing 120, object database 130 and display device 145.

In one embodiment, the CAD application 105 manages and renders the alignment, characteristics, and geometry of the structure represented by the CAD drawing 120. As shown, the CAD model 120 may include both 2D objects used to generate architectural plan views (e.g., a 2D floorplan) and 3D objects used to generate 3D views (e.g., a 3D rendering) of the building or structure being modeled. Preferably, the Architectural Desktop or Autodesk Building Systems applications and associated utilities available from Autodesk®, Inc. may be used. The display device 145 provides an on-screen display of the building or structure being modeled using the 2D or 3D objects included in the CAD model 120. As a user adds AEC elements to the CAD model 120, the display device 145 updates the representation of the CAD drawing 120 presented to the user. Information regarding the AEC elements and the 2D and 3D geometry of the CAD model 120 may be stored in object databases 130. The object database 130 includes the arrangement, geometry, and other properties of the drawing elements that may be included in a CAD model 120.

The user input device 115 allows users to interact with the GUI interface 110 and the CAD application 105 using known elements such as grips, drag and drop features, buttons, menu bars, shortcut keys, etc. Typically, user input devices 115 include a mouse pointing device and a keyboard but are not so limited and other input devices 115 that may be provided include tablets, touch screens, etc.

Creating Space Objects from a CAD Model

Figure 2:
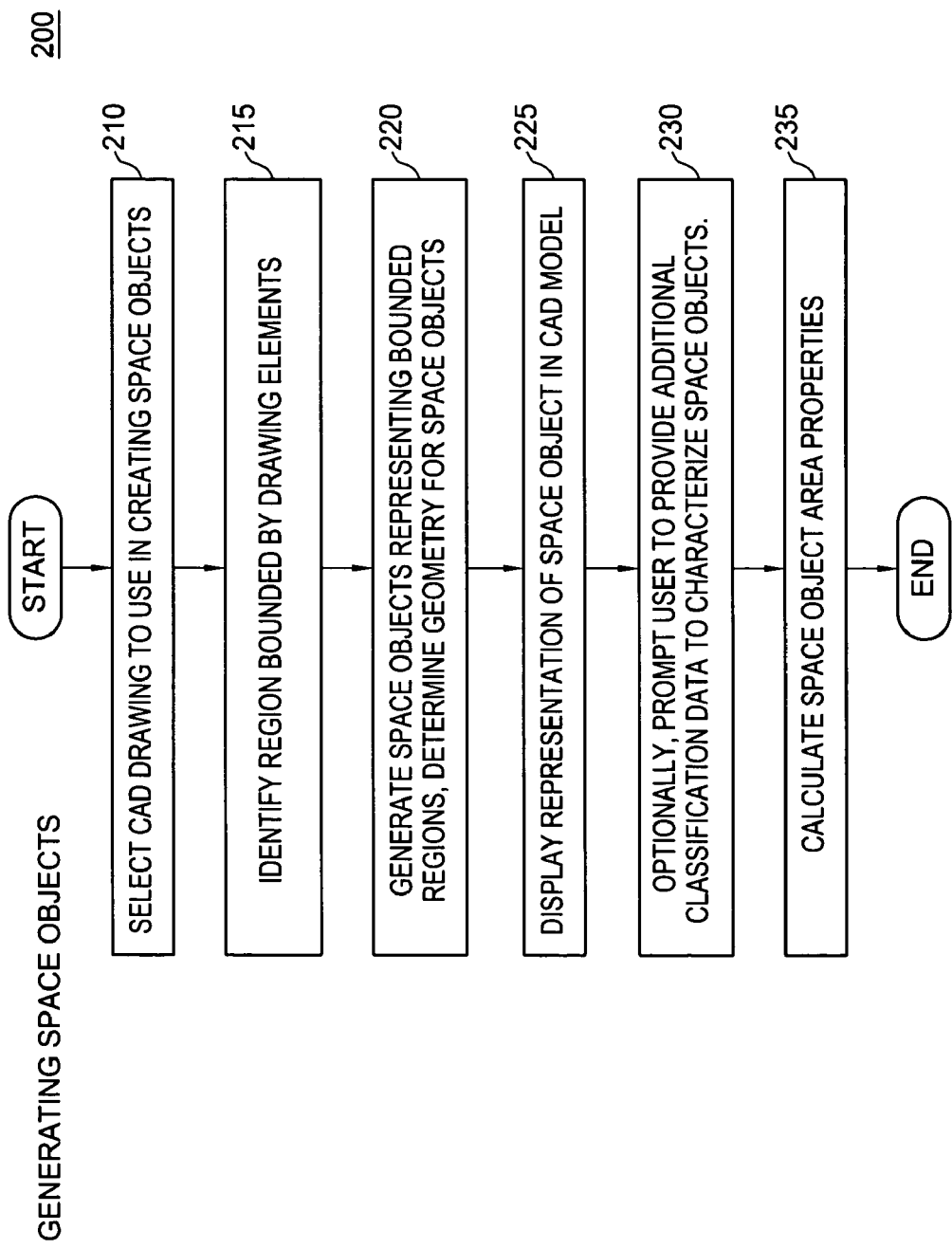
FIG. 2 is a flow diagram illustrating a method for generating a set of space objects from a CAD model or drawing, according to one embodiment of the invention.

FIG. 2 is a flow diagram illustrating a method 200 for generating a set of space objects from the drawing elements present in a CAD model 120, according to one embodiment of the invention. The method 200 allows users to direct the CAD application 105 to automatically generate space objects from a given CAD model 120. Alternatively, users may interact with the GUI interface 110 to generate a space object manually (as described below in conjunction with FIG. 6). Persons skilled in the art will understand that any system configured to perform the method steps illustrated in FIG. 2, in any order, is within the scope of the present invention.

As shown, the method 200 begins at step 210 where a user identifies the CAD model 120 for which space objects are to be generated. Elements of the CAD model 120 may be spread across multiple drawings or files that are referenced together. Accordingly, the user may specify both a CAD model 120 and any references to external drawings or files that should be included in generating the space objects. The user may also select options such as which set of standards (e.g., BOMA, SIS, etc.) to use in defining the geometry associated with the various space objects. Other options may include which types of AEC elements may be used as a boundary when generating the space objects or the offsets to use in calculating gross, net, and useable areas from geometry of the space objects.

At step 215, the CAD application 105 identifies spaces in the CAD model 120 bounded by a set of elements (e.g., AEC elements representing walls, doors, windows, or simpler elements such as lines, arcs, etc.). For example, one technique that may be used by the CAD application 105 includes systematically selecting a point within the geometry of a CAD model 120, calculating rays projecting along multiple vectors from the point, and identifying drawing elements that intersect with the rays. AEC elements of the CAD model 120 that intersect with the rays may be used to define the geometry of a space object. Another technique includes selecting an element that may act as a boundary for a space object (e.g. a wall) and identifying connected elements until a closed area is identified. However, no particular technique is required. Additionally, space objects may be generated for spaces in a CAD model 120 that do not include a fully enclosed area. For example, the CAD application 105 may be configured to make presumptions about doors, entrances, archways in a wall, irregular ceilings, etc., to generate space objects.

At step 220, the CAD application 105 may be configured to generate a space object representing each area or volume in the CAD model 120 bounded by a set of drawing elements (e.g., the walls bounding a room). In one embodiment, the space object includes data representing the geometry of the area of open space in the CAD model 120 represented by the space object. Once generated, the CAD application 105 may manage the geometry of a space object independently from the bounding elements. At the same time, space objects may be associated with each of the bounding elements used to generate the geometry for each individual space object. Associating each of the space objects with a set of bounding elements allows the space objects to be updated as changes are made to the CAD model 120.

At step 225, the CAD application 105 may display a representation of the space object in the CAD model 120. For example, the CAD application 105 may display dashed lines along the perimeter of the geometry of a space object. The GUI interface 110 may allow the user to toggle the display of space objects on and off. At step 230, the CAD application 105 may prompt the user to provide additional information related to the calculation of areas for a particular space object. For example, the BOMA standards calculate useable, net, and/or gross areas differently depending on whether a space is classified as a "store" or an "office." At step 235, the CAD application 105 may calculate values for areas or volumes associated with the space object such as net, usable, and gross areas and/or volumes.

Figure 3:
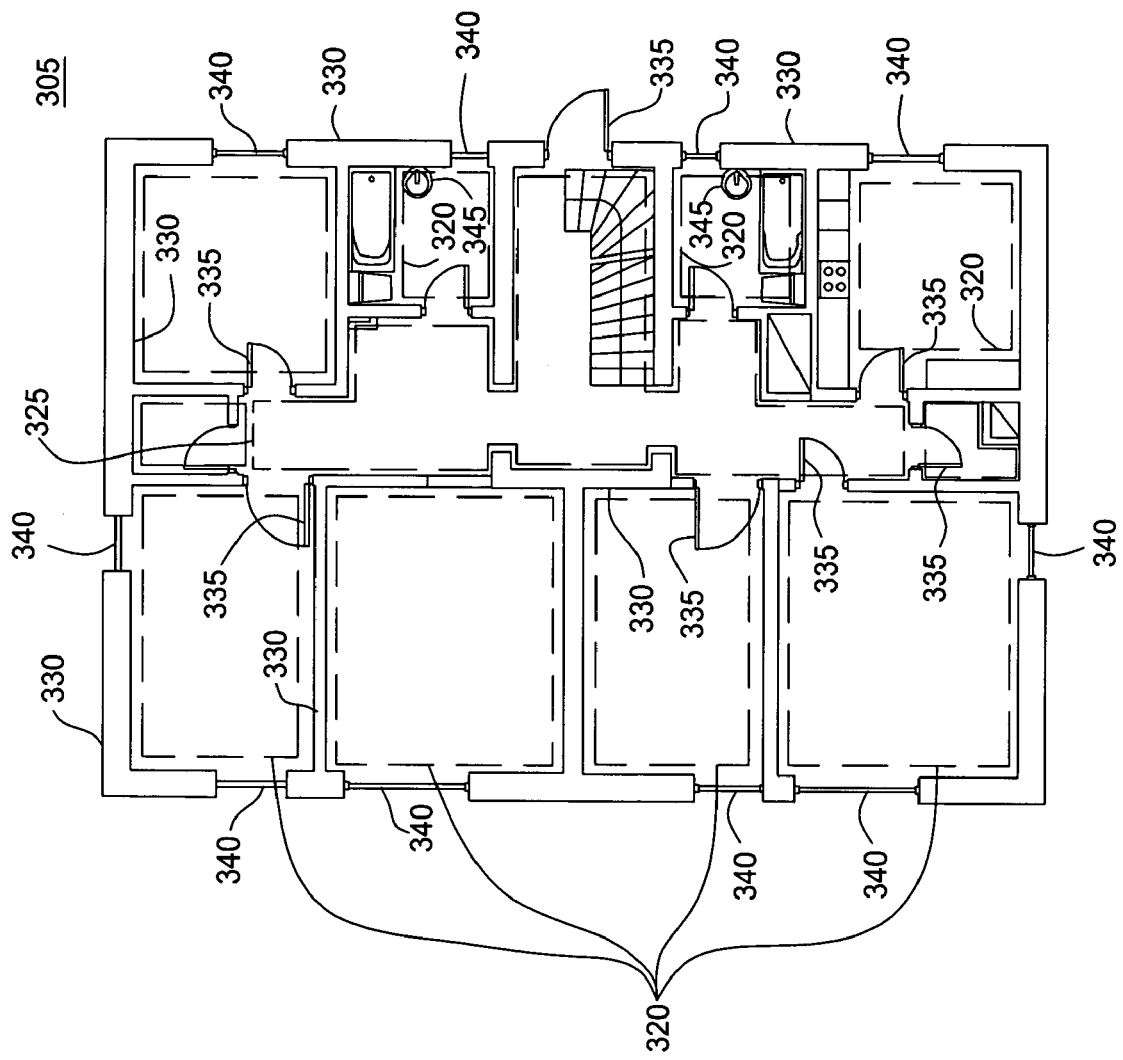
FIG. 3 illustrates an exemplary application screen view of a CAD drawing of a floor plan, according to one embodiment of the invention.

FIG. 3 illustrates an application screen view depicting a CAD model 120 of a floor plan 305, according to one embodiment of the invention. The floor plan 305 depicts a typical example of an architectural plan of a residential home. As shown, the floor plan 305 includes AEC elements such as walls 330, doors 335, windows 340, and fixtures 345. In addition, the floor plan 305 shows multiple space objects 320 and 325 using dashed lines to show the geometry of each individual space object. The space objects may be associatively linked to the AEC elements used to generate the geometry of a given space object. Thus, if the user modifies any of the AEC elements associated with a space object, the properties of the affected space object may be recalculated. For example, if the user selects to move one of the walls 330 illustrated in floor plan 305, any space objects associated with the moved wall may be updated, without the user having to regenerate all the space objects for the CAD model 120. Modifications to space objects that occur in response to changes to a CAD model 120 are described in greater detail below in conjunction with FIG. 8.

Figure 4:
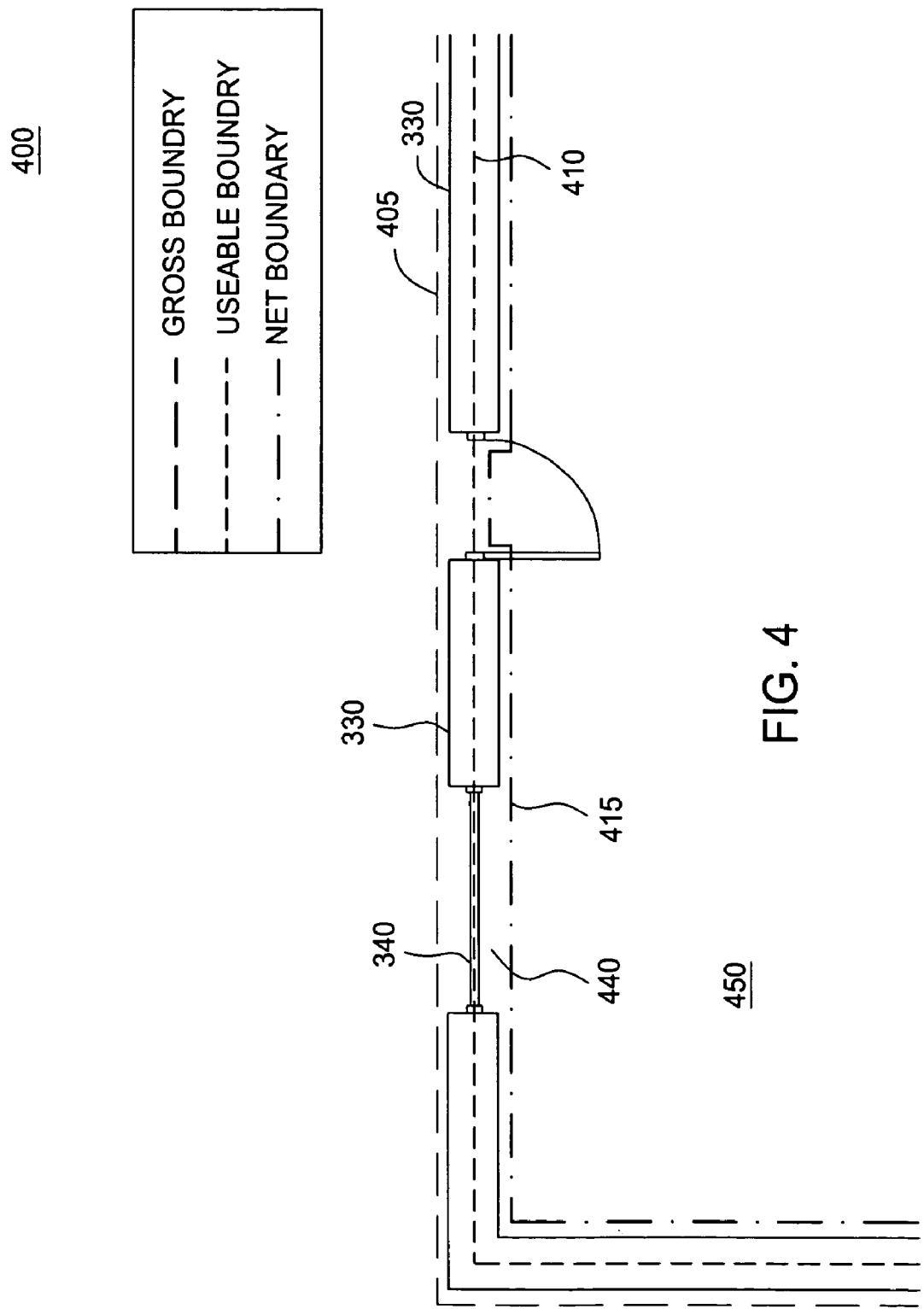
FIG. 4 is an exemplary plan view of a portion of a CAD drawing that includes a display of boundaries for net, usable, and gross areas of a space object, according to one embodiment of the invention.

FIG. 4 is an exemplary plan view 400 of a portion of a CAD model 120, according to one embodiment of the invention. As shown, the plan view 400 includes a section of wall 330, a door 335 and, and a window 340 that form part of room 450. In addition, the plan view 400 displays the boundaries for gross area 405, net area 410, and usable areas 415 for a space object representing the area of the room 450. As described above in conjunction with FIG. 2, the geometry for the useable, net, and gross areas may be calculated from the geometry of a space object and a selected rule for specifying offsets between the gross, net, and useable boundaries. In this example, the gross area for the room 450 is calculated from the exterior perimeter. The useable area is calculated along the centerline of the wall, including the centerline of the door 335. The net area borders the interior of the room 450, including the centerline of the doorway, but does not include the area of window ledge 440.

In one embodiment, the offsets between the gross, net and useable areas may be calculated from an offset value specified by the user. The offsets may be dictated by an established standard, by the space style, or by manually manipulating the space object. Other AEC elements (styles and objects) in a given drawing may (or may not) be considered when the rule is applied. However, the other AEC elements do not constrain how the space should react. This behavior is defined by the rules of the standard. A particular AEC element may include a style definition specifying how boundaries are calculated for a space object associated with that AEC element. For example, the wall section 330 may specify that the outer surface of the wall should coincide with the gross boundary 405, the net boundary 410 should run along the centerline of the wall 330 and the inner surface of the wall 330 should coincide with the usable boundary 415. AEC elements representing doors, windows, etc, may have similar rules. As another alternative, the gross, net, and useable boundaries of a given space object may be generated by applying the rules of an established standard such as the BOMA, SIS, or DIN standards.

Figure 5:
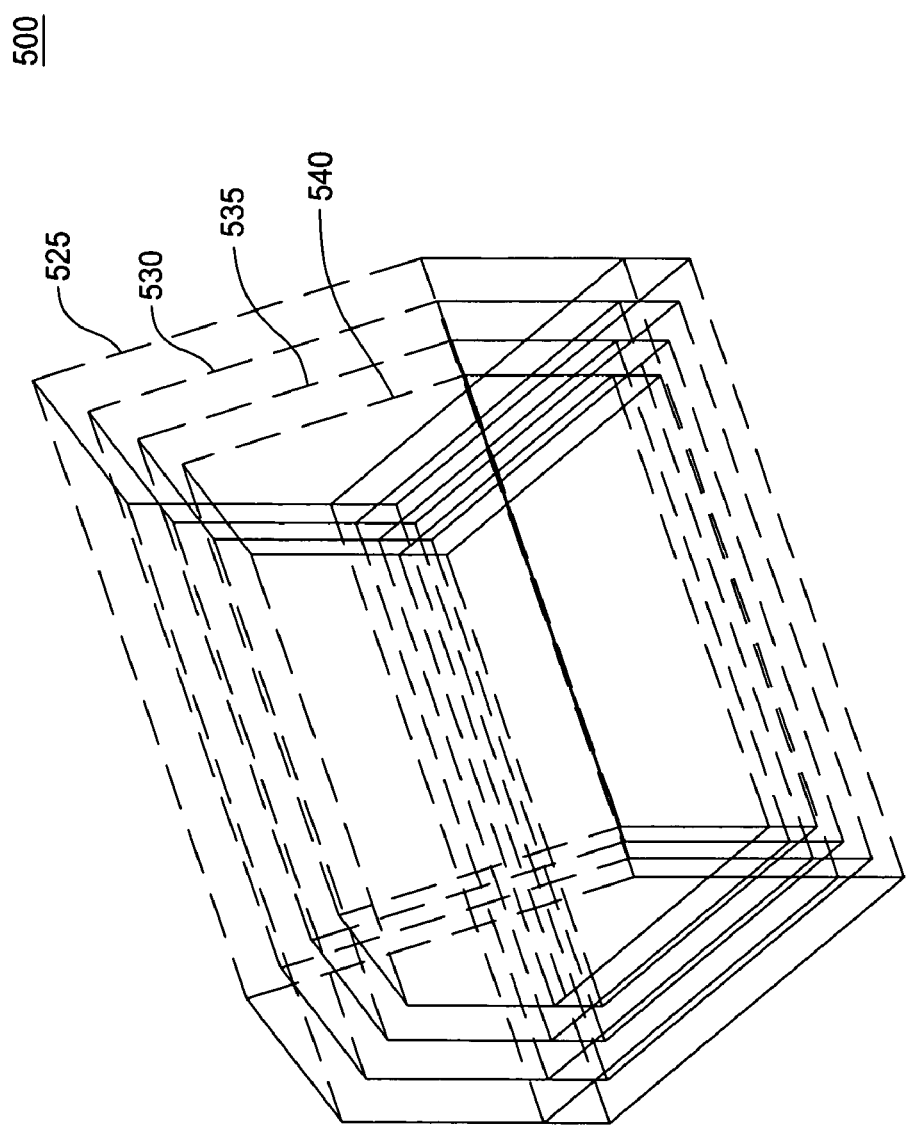
FIG. 5 illustrates an isometric view of a 3D space object 500, according to one embodiment of the invention

FIG. 5 illustrates an isometric view of a 3D space object 500, according to one embodiment of the invention. As shown, space object 500 includes the volumes defined by the four perimeter boundaries: base volume 525, gross volume 530, net volume 535, and useable volume 540. Volumetric calculations for the base volume 525, gross volume 530, net volume 535, and useable volume 540 may be calculated from the geometry of the particular space object. In addition, offsets between different volume boundaries may be determined using any of the same techniques just described in calculating gross, net and useable areas of a space object.

Figure 6:
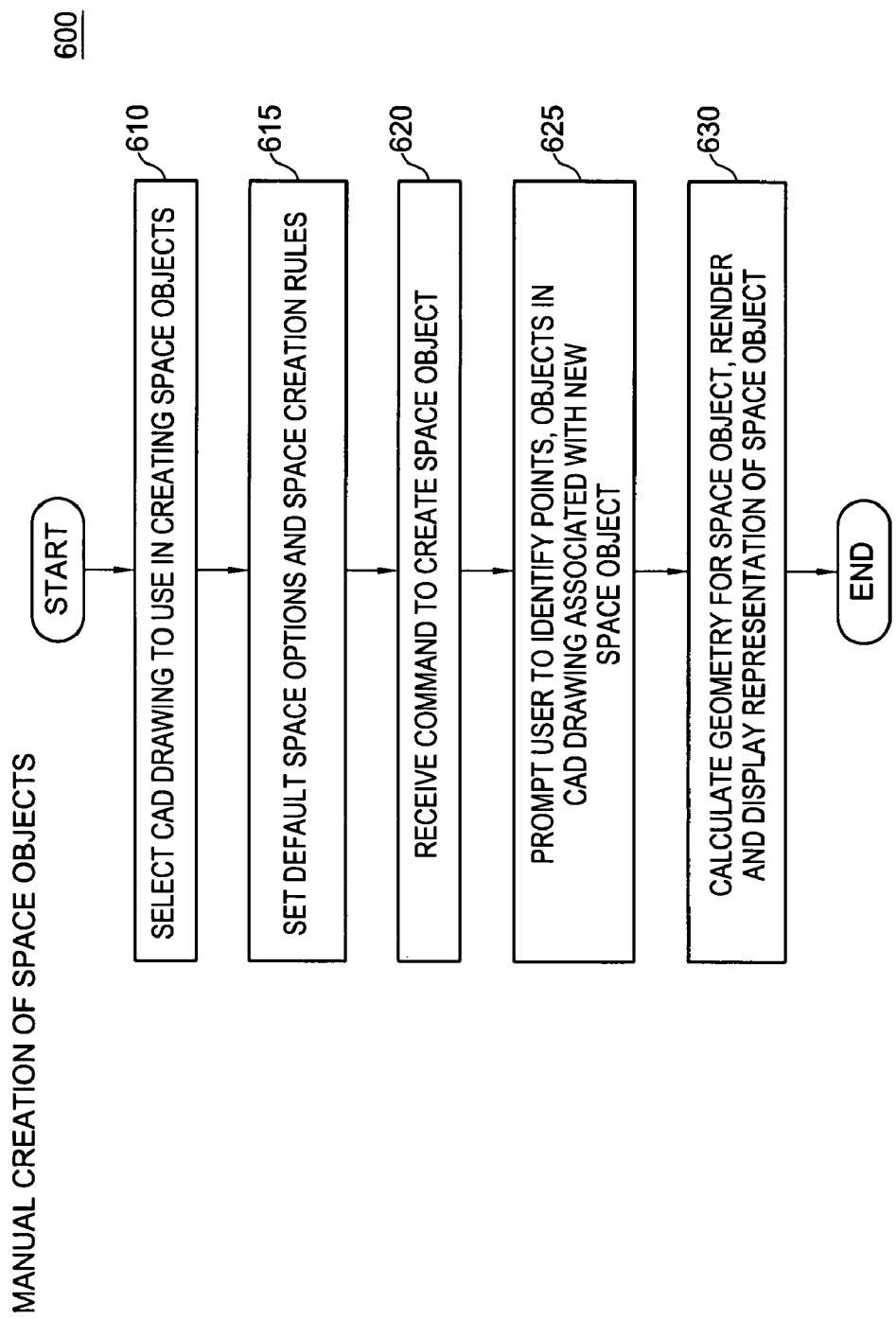
FIG. 6 is a flow diagram illustrating a method for generating a space objects from elements present in a CAD drawing or model, according to one embodiment of the invention.

FIG. 6 is a flow diagram illustrating a method 600 for generating a space object from elements present in a CAD drawing or model, according to one embodiment of the invention. The method 600 provides an alternative to the method 200 of FIG. 2 for generating a space object. Rather than automatically generating a space object from elements in a CAD model 120, the method 600 allows a user to identify the specific drawing elements to use in generating a space object. Doing so allows users to define boundaries for complex space objects that may (or may not) be associated with the AEC or drawing elements present in the CAD model. Thus, the method 600 enables users to create a space object that includes multiple rooms or regions of a drawing. Persons skilled in the art will understand that any system configured to perform the method steps illustrated in FIG. 6, in any order, is within the scope of the present invention.

The method 600 begins at step 610 where a user identifies the CAD model or drawing for which a space object is to be generated. At step 615, the user selects options for the space object being defined such whether to use an established standard to calculate gross, net or useable areas and/or volumes or to use style based offsets for these areas and/or volumes. At step 620, the user may begin selecting the bounding elements of the space object (e.g., a set of walls enclosing an area within CAD model 120). In response, the CAD application 105 may prompt a user to identify a point within each region that should bound each space object or to identify bounding elements of the desired space object. To create a complex or irregular footprint for a space object, for example, the user may be required to identify the specific drawing elements that should be used. Accordingly, at step 625, the user may be prompted to select points representing specific locations in the drawing or select AEC elements that form the boundaries or partial boundaries of the desired space object.

At step 630, once the bounding elements of a space object are fully defined, the space object may be rendered on display device. Additionally, at step 630, the properties of the space object such as area and volume may be calculated and associated with the space object. In one embodiment, the user may interact with GUI interface 110 to view these various properties. For example, at step 630, the interface 110 may display boundaries of a space object as a shaded region in 3D views, or display the dashed lines representing useable, net, and/or gross boundaries in 2D views. Once the space object is generated and displayed, the method 600 terminates.

Figure 7:
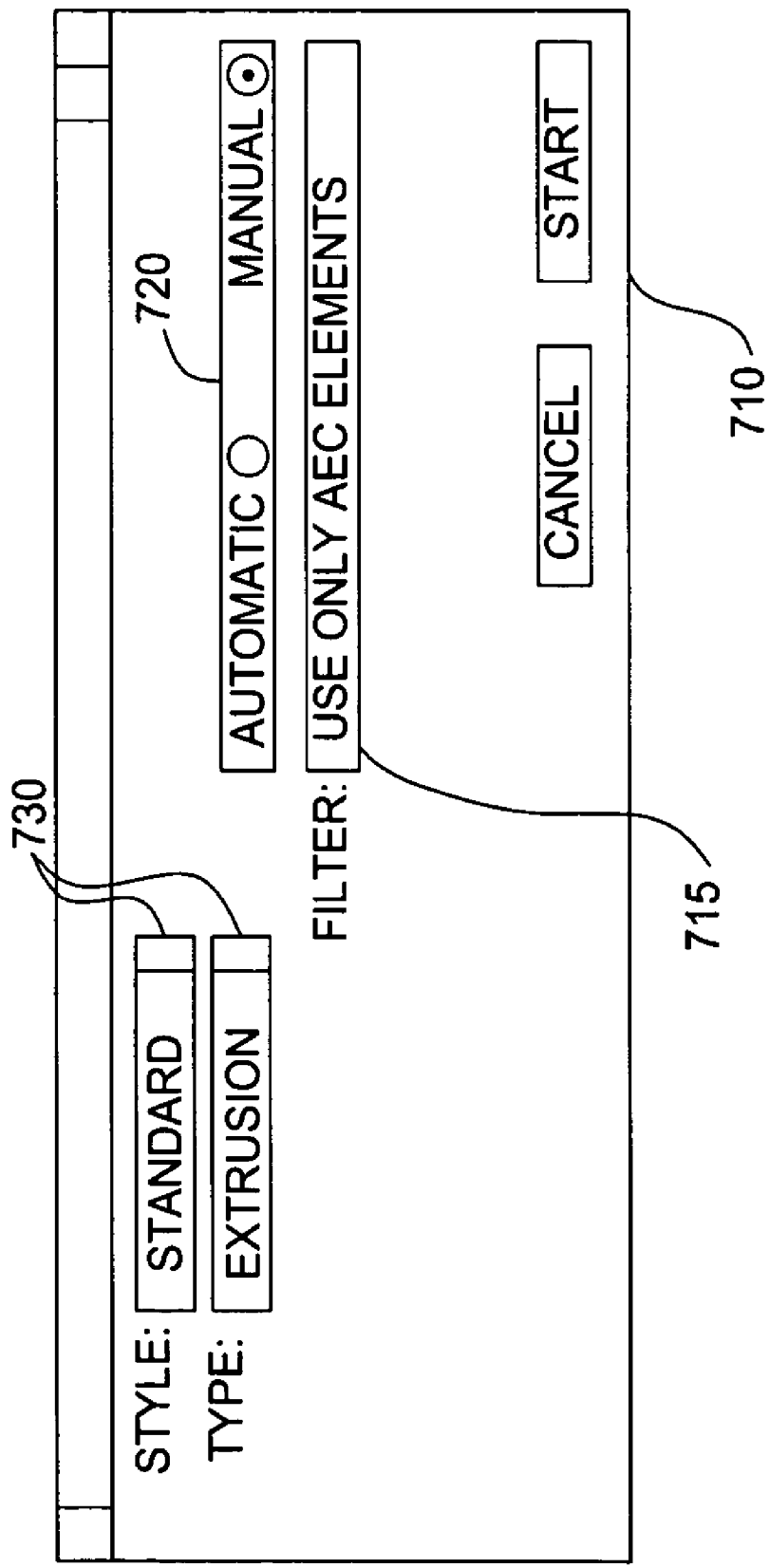
FIG. 7 is an exemplary dialog box used to specify options for generating a space object, according to one embodiment of the invention.

FIG. 7 illustrates an exemplary dialog box 710 for selecting space object related options, according to one embodiment of the invention. As shown, dialog box 710 includes drop-down boxes 730, radio buttons 720 and filter 715. The elements of dialog box 710 allow the user to specify options used by the CAD application 105 when generating a space object. Illustratively, a filter 715 is set to "use only AEC elements." This specifies that the elements of the CAD model 120 that may be selected to include in generating a space object are limited to AEC elements. This setting may be used to exclude drawing elements such as lines and arcs from being used to generate space objects. Drop down boxes 730 allow a user to set a style and a type for a space object. Illustratively, the settings of "standard" and "extrusion" represent a choice to generate a 3D space object extruded from a 2D bounding plane. That is, the user specifies the AEC elements bounding a perimeter (e.g., the walls of a room), and the CAD application 105 will extrude the perimeter to generate the geometry of the 3D space object. Of course, depending on the configuration of CAD application 105 and graphical user interface 110, users may be presented with a variety of configurable objections to control how CAD application 105 generates a space object.

Modification of Space Objects in Response to Changes in CAD Model

Figure 8:
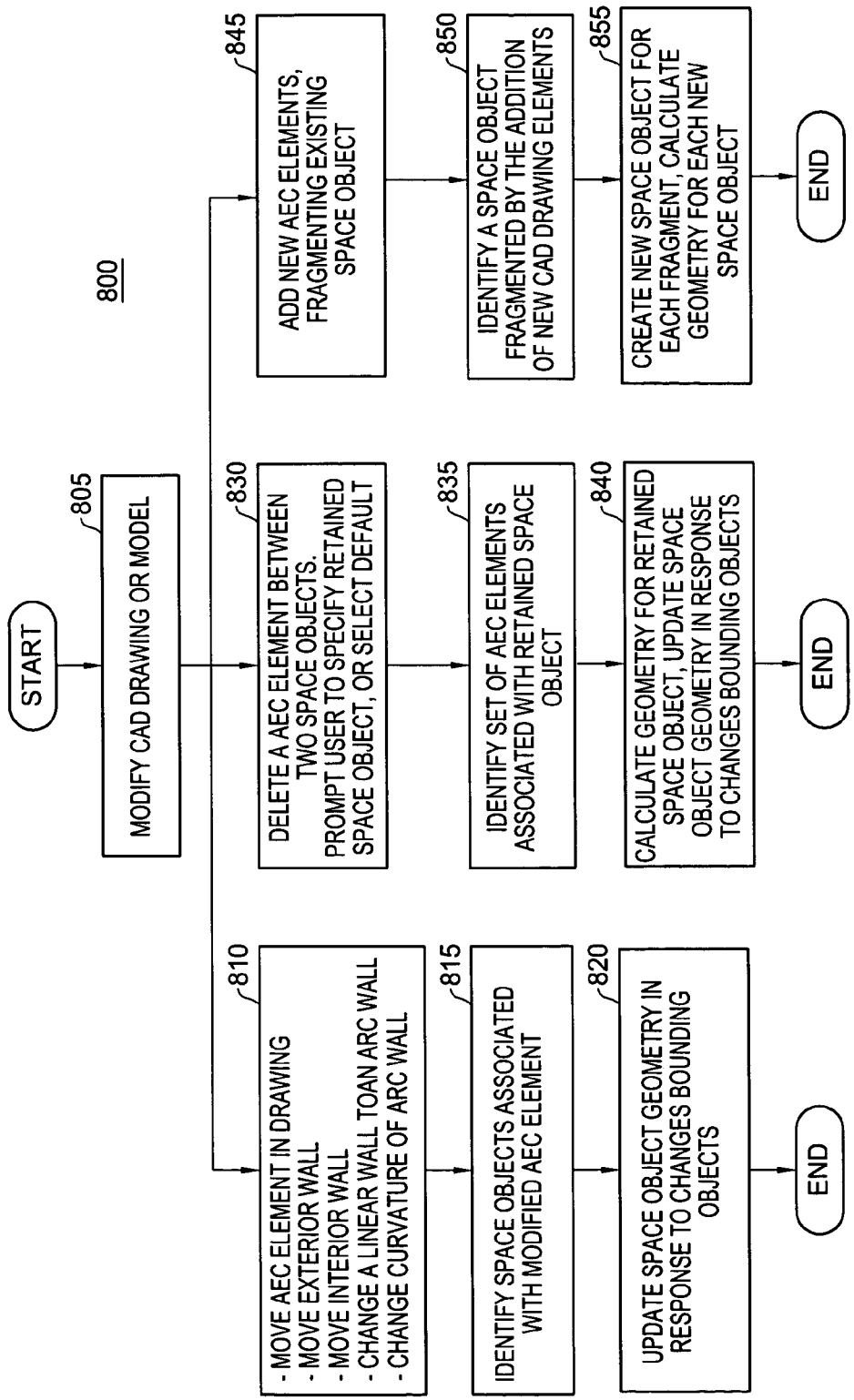
FIG. 8 is a flow diagram illustrating a method for modifying space objects in a CAD drawing, according to one embodiment of the invention.

FIG. 8 is a flow diagram illustrating a method 800 for updating the geometry of a space object in a CAD model 120, according to one embodiment of the invention. In one embodiment, a space object may be updated in response to changes made to elements of the CAD model 120. The method 800, therefore, begins at step 805 where a user modifies some aspect of a CAD model 120. For example, the user may move elements already present in the CAD model 120 (step 810), delete elements from the CAD model 120 (step 830), or add new elements to the CAD model 120 (step 845). In response, the CAD application 105 may trim, divide, subtract, merge or crop the space objects included in the CAD model 120.

More specifically, at step 810, the user may move or resize a drawing element included in the CAD model 120. Illustratively, the user may move an external wall, an internal wall, change the shape of a wall from being linear to one with an arc shape, or change the curvature of an arc wall. Typically, the GUI interface 110 includes grips for the AEC elements or drawing elements in the CAD model 120, allowing the user to perform drag and drop operations to move or modify any of these elements. At step 815, the CAD application 105 identifies each space object associated with the modified drawing element. As described, a space object may be generated by determining a set of elements in the CAD model 120 that form an enclosed or semi-enclosed boundary (e.g., the walls of a room). Therefore, by modifying an object associated with the boundary of a space object, the geometry of the space object may become inaccurate. In response, the CAD application 105 updates the geometry of each affected space object at step 820. Once the geometries for the relevant space objects are updated, any calculations for the area or volume, including net, useable or gross areas may be updated to reflect the modified geometry of the space object.

Returning now to step 830, the modification at step 805 may remove an element from the CAD model 120. The GUI interface 110 may provide the user with several ways to remove an element from a CAD model 120. Typically, the user selects a drawing element using a mouse pointing device or keyboard and invokes a cut function to remove a particular drawing element. For example, if an interior wall separating two rooms is removed, then space objects representing the two rooms may be identified. Once the affected space objects are identified, the user may be prompted to select which space object to retain. However, a default option may specify that the properties of the smaller space object are merged into the larger space object. At step 835, given the spaces associated with the deleted object, find all bounding AEC elements. In addition, drawing elements such as simple lines and arcs may be used to identify a space object boundary.

At step 840, the geometry for the retained space object may be calculated. For example, the CAD application 105 may use the boundary elements associated with both space objects to generate the geometry for the new space object. Once the geometry for the space object is updated, any calculations for area or volume, including net, useable or gross areas associated with an established standard may be updated to reflect the geometry of the merged space object.

Returning now to step 845, the modification at step 805 may add new drawing elements to a CAD model 120 that divides or fragments an existing space object. For example, a user may divide one room into two by adding an interior wall object. Doing so also divides a space object representing the room into two fragments, one for each of the two rooms. At step 850, the CAD application 105 identifies each space object fragmented by the addition of new drawing elements. A separate space object is then generated for each fragment and is associated with a new set of drawing elements. Each separate space object may inherit the proprieties of the fragmented space object (e.g., display properties, or what technique or standard to use to calculate gross, net, and useable areas). At step 855, once the drawing elements that form the boundary for each separate space object are determined, the geometry for the separate space object may be calculated. Calculations for area or volume, including net, useable or gross areas or volumes may be updated as well.

Alternatively, a user may select to divide an existing space object using GUI interface 110. For example, the GUI interface 110 may be configured to allow a user to specify a new boundary element for an existing space object that creates two or more fragments. For example, the user may select two or more points specifying a desired boundary and initiate a space object division operation along a line or plane defined from the specified points.

Advantageously, the updates to space objects may occur without requiring the user to manually redefine the geometry for a particular space object. For example, when the CAD application 105 expands the geometry of one space object and contracts the geometry of an adjacent space object, changes in perimeter, plan area and volume calculations may occur automatically.

Non-Physical Surface Boundary Space Objects

Figure 9:
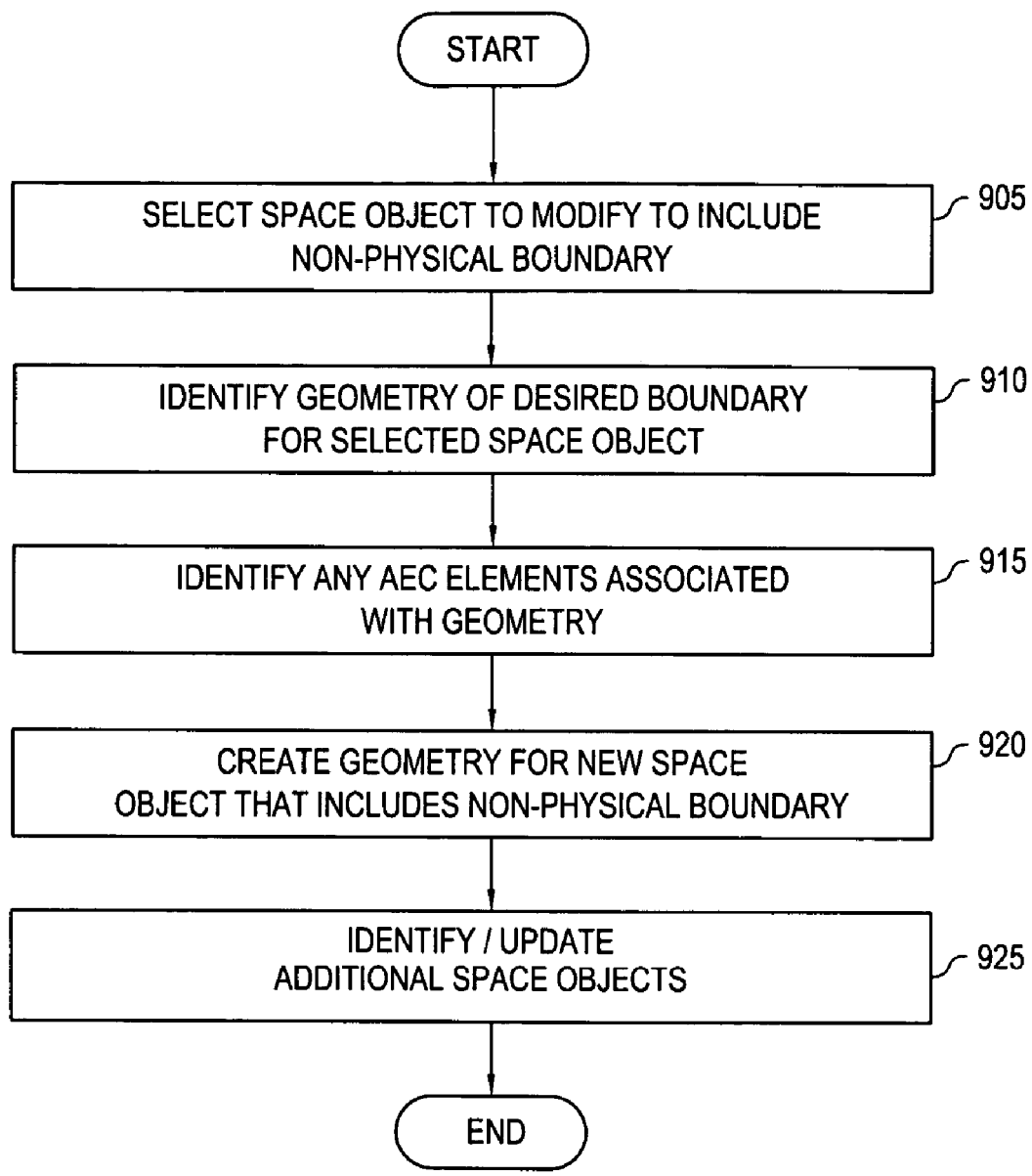
FIG. 9 is a flow diagram illustrating a method for creating space objects that include non-physical boundary elements, according to one embodiment of the invention.

FIG. 9 is a flow diagram illustrating a method 900 for modifying an existing space object to include a non-physical boundary, according to one embodiment of the invention. In one embodiment, the non-physical boundary provides a logical boundary element for a space object. The non-physical boundary element is not directly associated with AEC elements present in a CAD model 120. Non-physical boundary elements may be useful to modify large space objects in an open floor plan design. Persons skilled in the art will understand that any system configured to perform the method steps illustrated in FIG. 9, in any order, is within the scope of the present invention.

At step 905, the user selects a space object that exists in the CAD model 120. At step 910, the user specifies the geometry of the desired non-physical boundary for the selected space object. For example, the GUI interface 110 may allow the user to draw a freeform line specifying the non-physical boundary. Alternatively, the GUI interface 110 may allow the user to create a line or arc based to specify the non-physical boundary. At step 915, drawing elements associated with the space object are identified. At step 920, the bounding elements, including the new non-physical boundary element, are used to modify the geometry of the selected space object. At step 925, the CAD application 105 may identify additional space objects that need to be updated in this same fashion in response to the new non-physical boundary element.

Figure 10:
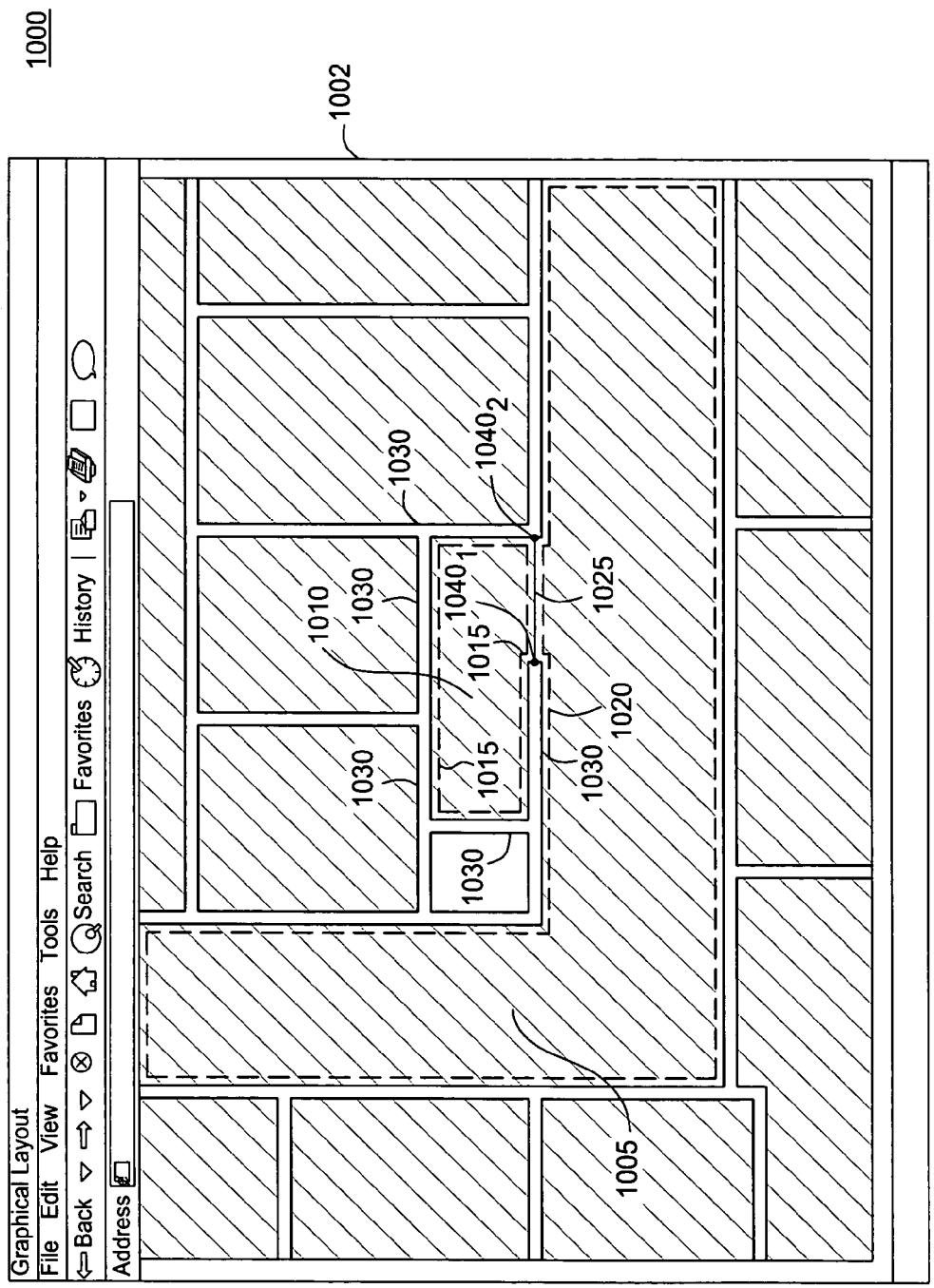
FIG. 10 is an exemplary application screen view of a space object with a partial non-physical boundary, according to one embodiment of the invention.

FIG. 10 illustrates an exemplary screen view 1000 of space objects 1015 and 1020 sharing a partial non-physical boundary 1025. Prior to the addition of non-physical boundary 1025, space object 1020 would have included the area associated with space object 1015. As shown, view 1000 includes object 1015 created by adding the non-physical boundary 1025 to the walls 1030 that form the room 1010. Points $1040_1$ and $1040_2$, are used to define a linear non-physical boundary 1025. The space object 1020 representing the area of corridor 1005 is divided along the surface of the space non-physical boundary 1025, shared as a bounding element of both space object 1015 and space object 1020.

In another embodiment, a user may select to edit the geometry of a space object directly. For example, a user may select a space object and be presented with a set of "grips" allowing the user to modify the geometry of the space object. However, as the geometry of a space object may be associated with a given set of AEC elements, manually editing the space object may invalidate the associations between the space object and its boundary elements. Accordingly, in an alternative embodiment, space objects may not be grip-editable in order to preserve associations with the AEC elements used to define the geometry of the space object.

Additionally, the user may define space objects with purely non-physical boundary elements. That is, the user may define a space object not associated by any AEC elements. For example, a "logical" space object may represent areas forming cubicles, patios, atriums, etc. To create a space object based purely on non-physical boundaries, the user may interact with the GUI interface 110 to specify a set of Points defining a rectangle or polygon as the 2D bounding plane of the space in a CAD model 120.

Rule Based Area and Volume Calculations

As described herein, the geometry of a space object may be used to calculate the area and volume represented by the space object. In one embodiment, how offsets between different areas such as gross, net, and useable areas are determined may be selected when space objects are or modified. Typically, the offsets define base-to-gross, base-to-net, and base-to-usable offsets. The base area or volume represents the area or volume of the space object, without reference to any of the standards, rules or offsets used to calculate gross, net, and useable areas and volumes. For example, FIG. 4 illustrates the boundaries for gross area 405, net area 410, and usable areas 415 for a space object representing the area of the room 450. The offsets between gross, net, and useable area boundaries may be determined according to established standards (e.g., the BOMA or SIS standards), based on default styles associated with the CAD drawing or elements thereof, or based on user input.

Figure 11:
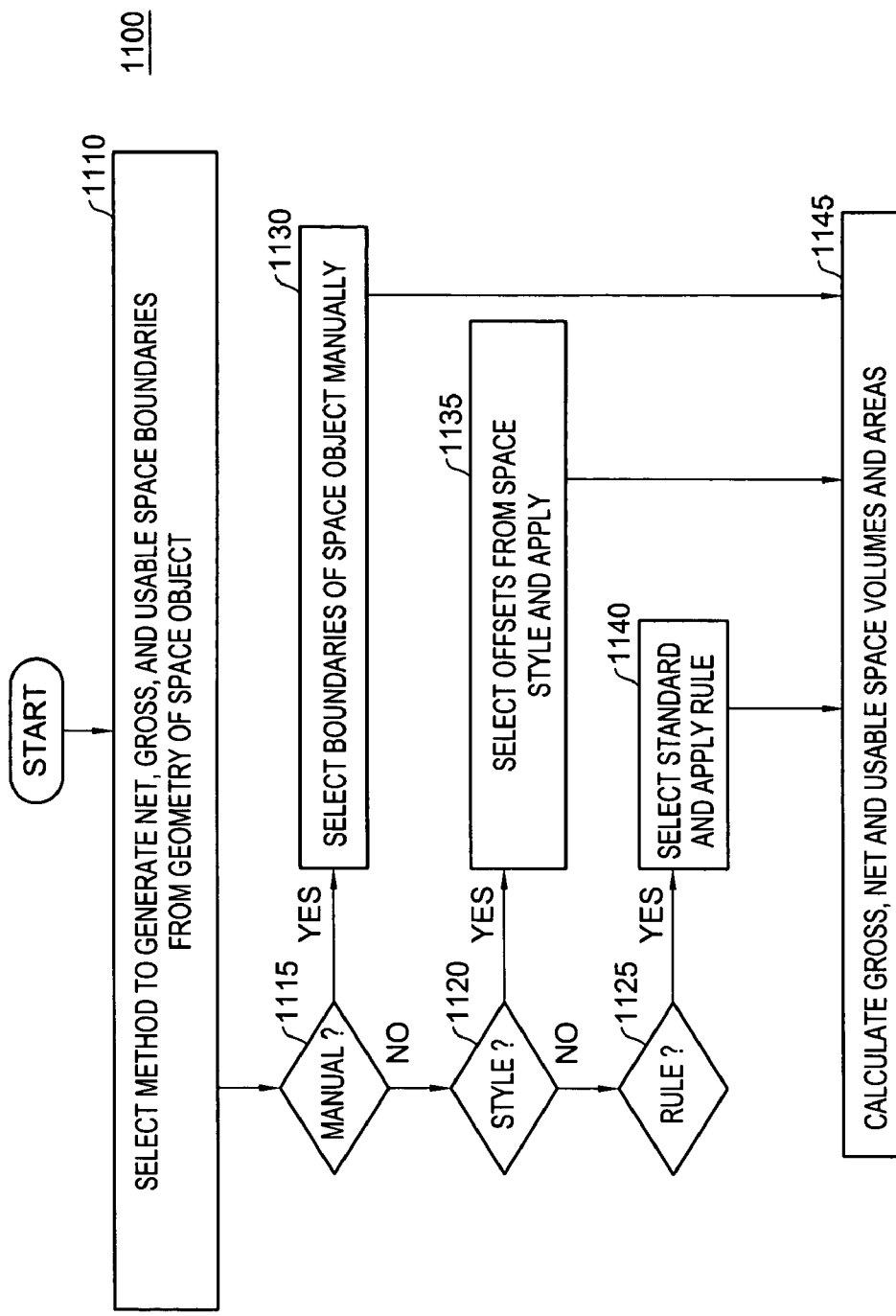
FIG. 11 is a flow diagram illustrating a method for calculating space volumes and areas from the geometry of space objects, according to one embodiment of the invention.

FIG. 11 is a flow diagram illustrating a method 1100 for calculating space areas and volumes from the geometry of a space object, according to one embodiment of the invention. Persons skilled in the art will understand that any system configured to perform the method steps illustrated in FIG. 11, in any order, is within the scope of the present invention.

At step 1105, the user selects a method used to calculate the gross, net and/or useable boundaries from the geometry of a space object. In one embodiment, the user may specify that offsets for net, usable, and/or gross areas should be calculated manually, by object style, or using rule based standards. At step 1115, if the user selects manual offsets, then the CAD application may prompt the user to specify the Points that represent the 2d bounding plane for the gross, net and usable boundaries. At step 1130, the user provides points for each offsets between each manually selected space boundary.

If, however, style based offsets are selected (step 1120), then the boundaries for gross, net and useable areas are determined from the space style offsets specified for particular AEC elements associated with a given space object. For example, a space style may have style properties defining offsets for gross, net and useable boundaries. At step 1135, the offsets specified by the space style are retrieved and used to specify the offset values to use in calculating the different boundaries for the space object.

Finally, if rule-based offsets are selected (step 1125), then the CAD application 105 may define gross net and useable boundaries according to rules specified by a selected standard. Illustratively, established standards such as such as the BOMA, SIS, or DIN standards may be used. Generally, a standard provides rules that may be used to define boundary areas from the geometry of a space object. For example, a standard may specify how to allocate building area and/or volume, whether to use a centerline or surface of a AEC element (e.g., a doorway), or whether to exclude or include certain areas from an area calculation, based on the physical geometry or function of the area. At step 1140, the standards to use are specified. The actual definition for the established standard may be provided to CAD application 105 in a variety of ways, including, using pre-programmed accessed by the CAD application 105. In one embodiment, the CAD application 105 may includes a variety of pre-programmed offset rules (e.g., the BOMA, SIS, or DIN standards), as well as an extensibility mechanism for adding new offset standards or rules.

Figure 12:
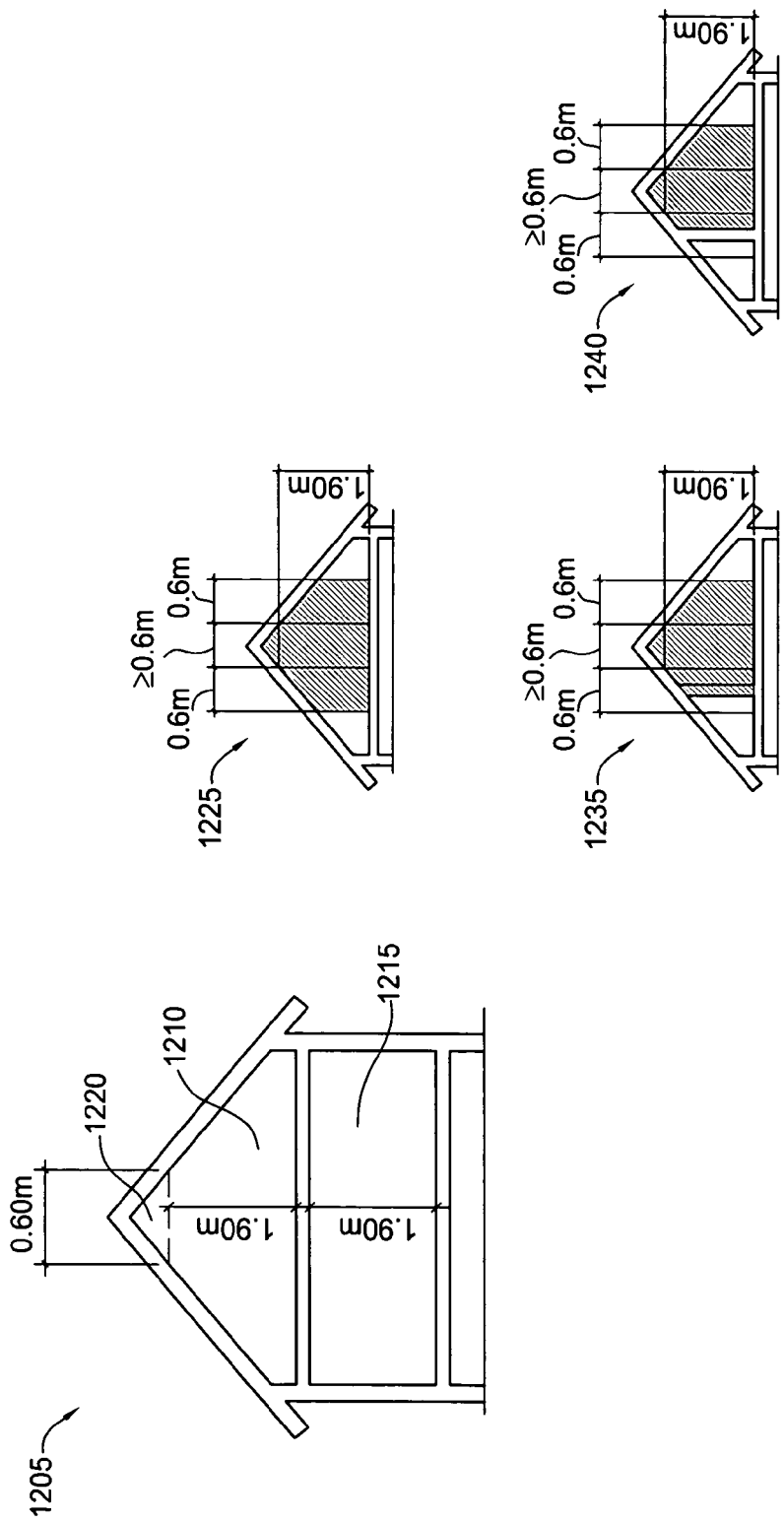
FIG. 12 illustrates an example of how different standards may be used to obtain different values for area calculations, according to one embodiment of the invention.

FIG. 12 illustrates an example of space area values calculated for different space objects in a CAD model 120, according to one embodiment of the invention. As shown, FIG. 12 includes a cross section view of a structure 1205. The room 1210 of the structure 1205 includes a region with a ceiling height above 1.9 meters and a region on either side below 1.9 meters, due to the sloping roofline. The SIS rules specify that the usable area of a room includes a region where the height is above 1.9 meters (with a minimum width of 0.6 meters) and an area of at most 0.6 meters beyond the point where the height falls below the 0.9 meters. Since the height of room 1215 exceeds the minimum 1.90 m height, the SIS rule does not affect the area calculation for the room 1215. However, the SIS rules limit the net area of room 1210. Accordingly, a space object generated for room 1210 that uses the SIS rules will limit the reported area of the room 1210.

As shown in view 1225, the area of room 1210 may be calculated as the area offset 0.60 m from both sides the room 1210 where the roofline drops below the 1.9 m minimum. To continue with this example, assume that a user adds a wall element to the room 1210. Views 1235 and 1240 show the difference between a gross area and a useable area based on the addition of the wall. Specifically, the gross area of the room 1210 may include the outer edge of the wall, as shown by the shaded region in view 1235. In contrast, view 1240 shows how the useable may be offset from the gross area to include the inner plane of the wall added to room 1210. Thus, reports or documentation generated from the space object representing room 1210 will reflect differences in area based on the different boundary rules.

As described herein, space objects represent properties of open spaces in a CAD drawing or model, such as the area and volume associated with a bounded region. Typically, the space objects represent the area of rooms appearing in a construction plan. Embodiments of the invention provide space objects that may be used to calculate areas and volumes based on a number of different boundaries. For example, established standard may define how to calculate the gross, net, and/or useable areas of a room represented by the space objects. Such standards may govern the allocation of building area, or limit the contribution of an area based on its structure or function. Thus, embodiments of the invention may be used to provide a variety of information regarding floor area, wall area, room volume, etc. Values generated using space objects may be advantageously used to generate estimates of construction cost, energy requirements and analysis, area calculations of gross, net, and usable area, etc. Further, these values may be automatically updated when a CAD model is edited, or as it evolves throughout the course of a design project.

While the foregoing is directed to embodiments of the present invention, other and further embodiments of the invention may be devised without departing from the basic scope thereof, and the scope thereof is determined by the claims that follow.

What is claimed is:

1. A computer-implemented method for performing calculations related to a region of open space in a computer-aided design (CAD) model generated on a computer within a CAD application environment, the method comprising:
   identifying a region within the CAD model at least partially bounded by a set of drawing elements, wherein the CAD model is displayed on a display device;
   generating a space object representing the region, wherein the geometry of the space object is determined based on the set of drawing elements bounding the region, and wherein the space object is an element within the CAD model configured to represent properties of the region;
   associating the space object with the set of drawing elements bounding the region;
   calculating at least one area associated with the region based on the geometry of the space object;
   automatically updating the geometry of the space object in response to a change to at least one of the drawing elements; and
   displaying on the display device the set of drawing elements within the CAD model, including the change to the at least one drawing element, and the updated space object.

2. The computer-implemented method of claim 1, wherein the set of drawing elements is selected from architecture, engineering, construction elements, or line and arc drawing elements included in the CAD model.

3. The computer-implemented method of claim 1 wherein calculating at least one area comprises calculating the gross, net, and useable areas according to an externally defined standard.

4. The computer-implemented method of claim 1, wherein at least a portion of the region at least partially bounded by the set of drawing elements includes a non-physical boundary element.

5. The computer-implemented method of claim 1, wherein the change to one of the associated drawing elements comprises a modification to the geometry or position of a drawing element in the CAD model.

6. The computer-implemented method of claim 1, wherein the change to one of the associated drawing elements comprises removing a drawing element from the CAD model, and wherein the step of updating the geometry of the space object comprises merging the geometries of two or more space objects associated with the removed drawing object.

7. The computer-implemented method of claim 1, wherein the change to one of the associated drawing elements comprises adding a drawing element to the CAD model, and wherein the step of updating the geometry of the space object comprises, dividing the space object into two or more space objects.

8. The computer-implemented method of claim 1, wherein a user interacts with a graphical user interface to identify the region within the CAD model bounded by a set of drawing elements.

9. The computer-implemented method of claim 1, wherein the one area is calculated based on offset values determined by a space style associated with the CAD model or calculated based on points specifying a two-dimensional bounding plane.

10. A computer-readable storage medium, excluding carrier waves or signals, storing instructions that, when executed by a processor, cause the processor to calculate areas related to a region of open space in a computer-aided design (CAD) model generated on a computer within a CAD application environment, by performing the steps of:

identifying a region within the CAD model at least partially bounded by a set of drawing elements, wherein the CAD model is displayed on a display device;

generating a space object representing the region, wherein the geometry of the space object is determined based on the set of drawing elements bounding the region, and wherein the space object is an element within the CAD model configured to represent properties of the region;

associating the space object with the set of drawing elements bounding the region;

calculating at least one area associated with the region based on the geometry of the space object;

automatically updating the geometry of the space object in response to a change to at least one of the drawing elements; and displaying on the display device the set of drawing elements within the CAD model, including the change to the at least one drawing element, and the updated space object.

11. The computer-readable storage medium of claim 10, wherein the set of drawing elements is selected from architecture, engineering, construction elements, or line and arc drawing elements included in the CAD model.

12. The computer-readable storage medium of claim 10, wherein at least a portion of the region at least partially bounded by the set of drawing elements includes a non-physical boundary element.

13. The computer-readable storage medium of claim 10, wherein the change to one of the associated drawing elements comprises a modification to the geometry or position of a drawing element in the CAD model.

14. The computer-readable storage medium of claim 10, wherein the change to one of the associated drawing elements comprises removing a drawing element from the CAD model, and wherein the step of updating the geometry of the space object comprises merging the geometries of two or more space objects associated with the removed drawing object.

15. The computer-readable storage medium of claim 10, wherein the change to one of the associated drawing elements comprises, adding a drawing element to the CAD model, and wherein the step of updating the geometry of the space object comprises, dividing the space object into two or more space objects.

16. The computer-readable storage medium of claim 10, wherein a user interacts with a graphical user interface to identify the region within the CAD model bounded by a set of drawing elements.

17. The computer-readable storage medium of claim 10, wherein the one area is calculated based on offset values determined by a space style associated with the CAD model or calculated based on points specifying a two-dimensional bounding plane.

18. A computing device that is part of a computer-aided design (CAD) application environment, the computing device comprising:

a processor;

a display device; and a memory configured to store an application that includes instructions which, when executed by the processor, cause the processor to perform operations for performing calculations related to a region of open space in a CAD model that is displayed on the display device, by performing the steps of:

identifying a region within the CAD model at least partially bounded by a set of drawing elements, generating a space object representing the region, wherein the geometry of the space object is determined based on the set of drawing elements bounding the region, and wherein the space object is an element within the CAD model configured to represent properties of the region, associating the space object with the set of drawing elements bounding the region, calculating at least one area associated with the region based on the geometry of the space object, automatically updating the geometry of the space object in response to a change to at least one of the drawing elements, and displaying on the display device the set of drawing elements within the CAD model, including the change to the at least one drawing, and the updated space object.

19. The computing device of claim 18, wherein the set of drawing elements is selected from architecture, engineering, construction elements, or line and arc drawing elements included in the CAD model.

20. The computing device of claim 18, wherein the change to one of the associated drawing elements comprises removing a drawing element from the CAD model, and wherein the step of updating the geometry of the space object comprises merging the geometries of two or more space objects associated with the removed drawing object.

21. The computing device of claim 18, wherein the change to one of the associated drawing elements comprises adding a drawing element to the CAD model, and wherein the step of updating the geometry of the space object comprises, dividing the space object into two or more space objects.

* * * * *